(12) United States Patent
Kawakami

(10) Patent No.: US 8,708,511 B2
(45) Date of Patent: *Apr. 29, 2014

(54) SEMICONDUCTOR LIGHT SOURCE APPARATUS AND LIGHTING UNIT

(75) Inventor: Yasuyuki Kawakami, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 120 days.

This patent is subject to a terminal disclaimer.

(21) Appl. No.: 13/418,088

(22) Filed: Mar. 12, 2012

(65) Prior Publication Data

US 2012/0230007 A1    Sep. 13, 2012

(30) Foreign Application Priority Data

Mar. 10, 2011    (JP) ................... 2011-052374

(51) Int. Cl.
*F21V 9/16* (2006.01)

(52) U.S. Cl.
USPC ............................. 362/84; 362/283; 362/284

(58) Field of Classification Search
USPC .......... 362/2, 19, 84, 285, 293; 313/502–504; 257/98, E33.061; 428/690
See application file for complete search history.

(56) References Cited

U.S. PATENT DOCUMENTS

| | | | |
|---|---|---|---|
| 7,382,091 B2 * | 6/2008 | Chen et al. ................ | 313/512 |
| 8,294,357 B2 * | 10/2012 | Washizu et al. ............ | 313/501 |
| 2005/0269582 A1 | 12/2005 | Mueller et al. | |
| 2011/0116253 A1 * | 5/2011 | Sugiyama ................ | 362/84 |

FOREIGN PATENT DOCUMENTS

| | | |
|---|---|---|
| JP | 2004-55360 A | 2/2004 |
| JP | 2004-341105 A | 12/2004 |
| JP | 2006-005367 A | 1/2006 |

OTHER PUBLICATIONS

List of Potentially Related Pending Applications citing U.S. Appl. No. 12/972,056 to Yasuyuki Miyake filed Dec. 17, 2010 and U.S. Appl. No. 12/949,776 to Takashi Sugiyama filed Nov. 18, 2010.

* cited by examiner

*Primary Examiner* — John A Ward
(74) *Attorney, Agent, or Firm* — Kenealy Vaidya LLP

(57) ABSTRACT

A semiconductor light source apparatus can emit various color lights having a substantially uniform color tone and high brightness. The semiconductor light source apparatus can include a radiating substrate, at least one phosphor layer disposed on the radiating substrate and a semiconductor light source emitting blue light. The at least one phosphor layer can be composed of at least one of a glass phosphor and a phosphor ceramic. The light source can be located adjacent the phosphor layer so that the blue light having high brightness can be efficiently reflected on the radiating substrate via the phosphor layer while preventing the blue light from a mirror reflection on the phosphor layer. Thus, the disclosed subject matter can provide a semiconductor light source apparatus that can emit various uniform color lights having high brightness and a lighting unit using the light source apparatus, which can be used for general lighting, vehicle lighting etc.

20 Claims, 16 Drawing Sheets

SEMICONDUCTOR LIGHT SOURCE APPARATUS AND LIGHTING UNIT

This application claims the priority benefit under 35 U.S.C. §119 of Japanese Patent Application No. 2011-052374 filed on Mar. 10, 2011, which is hereby incorporated in its entirety by reference.

BACKGROUND

1. Field

The presently disclosed subject matter relates to a semiconductor light source apparatus and a lighting unit using the semiconductor light source apparatus, and more particularly to a high power semiconductor light source apparatus including a phosphor layer that can prevent a reduction of brightness caused by thermal quenching and a lighting unit that can also emit various color lights having a substantially uniform color tone and a large amount of light intensity that can be used for general lighting, such as a stage light, a street light, or a vehicle lamp such as a headlight, etc.

2. Description of the Related Art

Semiconductor light source apparatuses that emit various color lights by combining a phosphor layer with a semiconductor light-emitting device such as an LED have been popularly used for various fields. Recently, because brightness of the semiconductor light source apparatuses has improved, the range of applications for semiconductor light source apparatuses has expanded to fields such as general lighting, vehicle headlight, etc. Such light source apparatuses may become popular for additional uses in the future due to its improved brightness characteristics.

One conventional method for improving the brightness of semiconductor light source apparatuses which combine the phosphor layer with the semiconductor light-emitting device may include enhancing the excitation intensity of the phosphor layer by flowing a large current in the semiconductor light-emitting device. However, because heat is generated in the phosphor layer due to the large current, the transparent resin may be tarnished, especially when the transparent resin achieves high temperatures of more than 200 degrees Celsius. Because the transparent resin is mixed in the phosphor layer, the tarnish of the transparent resin results in absorption of a part of light excited by the phosphor layer, and therefore may cause a reduction of the excitation intensity.

In addition, a reduction of fluorescent intensity may be caused by a thermal quenching property of the phosphor layer due to the large current. The thermal quenching property is a phenomenon in which a fluorescent intensity of a phosphor becomes reduced when the phosphor is heated at a high temperature. Therefore, because the tarnish of the transparent resin and the reduction of the fluorescent intensity cause a reduction of a light intensity in semiconductor light source apparatuses that include a phosphor layer, it is difficult to improve the brightness of the semiconductor light source apparatuses by simply flowing a larger current.

To address this problem, a semiconductor light source apparatus using a phosphor layer that includes a phosphor particle without a transparent resin is disclosed in Patent Document No. 1 (Japanese Patent Application Laid Open JP2006-005367). FIG. 14 is a schematic structural view showing a conventional semiconductor light source apparatus including a phosphor layer, which is disclosed in Patent Document No. 1.

The conventional semiconductor light source apparatus includes a semiconductor light-emitting device 95 and a phosphor ceramic layer 92 including a phosphor particle without a transparent resin. The phosphor ceramic layer 92 may not include a transparent resin, and therefore tarnish of the phosphor ceramic layer 92 may not occur. In addition, because the phosphor ceramic layer 92 is made of a material having a low thermal sensitivity, thermal quenching may be prevented. Consequently, it may be possible for this semiconductor light source apparatus to improve brightness by simply flowing a large current therethrough.

However, in the conventional semiconductor light source apparatus, after light emitted from the semiconductor light-emitting device 95 is wavelength-converted via the phosphor ceramic layer 92, the light is emitted in the opposite direction of the semiconductor light-emitting device 95. Accordingly, light reflected on the phosphor ceramic layer 92 from the light emitted from the semiconductor light-emitting device 95 may return to the semiconductor light-emitting device 95 and may be absorbed in the semiconductor light-emitting device 95. The reflected light may cause a reduction of light use efficiency.

Moreover, heat generated from the phosphor ceramic layer 92 may be transmitted to the semiconductor light-emitting device 95 and may be radiated from a mounting substrate, on which the semiconductor light-emitting device 95 is mounted. However, because the semiconductor light-emitting device 95 also generates heat, the radiating efficiency of the semiconductor light source apparatus may not be high.

As described above, the conventional semiconductor light source apparatus is a light transmission type apparatus, which emits a wavelength converted light by passing light emitted from the light-emitting device 95 through the phosphor ceramic layer 92 that is located on the light-emitting device 95. In such a semiconductor light source apparatus, it may be difficult to improve a radiating efficiency of the phosphor ceramic layer 92, and therefore there may be limitations in super high-intensity lighting.

Accordingly, another conventional semiconductor light source apparatus of a reflection type is disclosed in Patent Document No. 2 (U.S. patent application Ser. No. 12/972,056 filed on Dec. 17, 2010) by applicant of the present application. FIGS. 15a and 15b are a schematic front view and a top view showing the other conventional semiconductor light source apparatus of the reflection type, which is disclosed in Patent Document No. 2.

The semiconductor light source apparatus 100 includes a solid state light source 105, and a phosphor layer 102 located away from the solid state light source 105, the phosphor layer 102 receiving excitation light emitted from the light source 105 and reflecting/emitting a wavelength converted light, which mixes light having a wavelength emitted from the phosphor layer 102 by absorbing a part of the excitation light emitted from the light source 105 through the phosphor layer 102 with another part of the excitation light that is not excited by the phosphor layer 102.

The phosphor layer 102 is located on a radiating substrate 106 via a reflective adhesive layer 107. The semiconductor light source apparatus 100 may efficiently reflect fluorescence having a different wavelength emitted from the phosphor layer 102 from that of the excitation light emitted from the light source 105 and the other part of the excitation light by using at least one of the reflective adhesive layer 107 and the radiating substrate 106. Therefore, the reflective type structure, in which the phosphor layer 102 does not contact with the light source 105, may allow the semiconductor light source apparatus 100 to emit light having the super high-intensity because the radiating efficiency of the phosphor layer 102 and the light source 105 can easily improve.

However, in the reflection type structure in which the phosphor layer 102 is located away from the light source 105, for example when a yellow phosphor such as YAG is used as the phosphor layer 102 and a blue LED is used as the light source 105, and when the semiconductor light source apparatus projects a wavelength converted light using a yellow fluorescent and a blue excitation light on a projection plane, for example, via a diffusing lens, the wavelength converted light projected on the projection plane may be subject to a light-emitting color variability.

FIG. 16 is an explanatory drawing for explanting the light-emitting color variability, which may be caused by the reflective type conventional light source apparatus. The conventional semiconductor light source apparatus 100 may include light having a substantially white color tone by an additive color mixture of the yellow fluorescent light emitted from the phosphor layer 102 and the blue excitation light emitted from the light source 105.

However, when a part of the blue excitation light is mirror-reflected on a top surface of the phosphor layer 102 as shown by an arrow in FIG. 16, the part of the blue excitation light may be projected as an enlarged blue light 171 on the projection plane 170 via a diffusing lens 115 as shown in FIG. 16. Hence, the enlarged blue light 171 may be projected as the light-emitting color variability on the light having a substantially white color tone, which is essentially emitted from the conventional semiconductor light source apparatus. As a result, the conventional semiconductor light source apparatus 100 may emit a wavelength converted light having little light-emitting color variability.

The above-referenced Patent Documents are listed below and are hereby incorporated with their English abstracts in their entireties.

1. Patent document No. 1: Japanese Patent Application Laid Open JP2006-005367
2. Patent document No. 2: U.S. application Ser. No. 12/972,056 filed on Dec. 17, 2010 and owned by Applicant of the present application.

The disclosed subject matter has been devised to consider the above and other problems, characteristics and features. Thus, an embodiment of the disclosed subject matter can include semiconductor light source apparatuses which can emit various color light having a substantially uniform color tone and high brightness and can efficiently radiate heat even when a high power semiconductor light-emitting device is used under a large current as a light source. In this case, an excitation light emitted from a high power semiconductor light-emitting device can be efficiently wavelength-converted by a phosphor layer without a mirror reflection on the phosphor layer and a reduction of light intensity, because the phosphor layer is located on a radiating substrate and does not include a substantially resin component and because the excitation light can enter into the phosphor layer so as not to be mirror-reflected on the phosphor layer.

SUMMARY

The presently disclosed subject matter has been devised in view of the above and other characteristics, desires, and problems in the conventional art. An aspect of the disclosed subject matter can include providing a semiconductor light source apparatus having high brightness and a substantially uniform light-emitting color tone, in which various color lights having a large amount of light intensity can be emitted by reflecting on a radiating substrate that can radiate heat generated from a phosphor layer while preventing excitation light from a mirror reflection on the phosphor layer. Another aspect of the disclosed subject matter can include providing lighting units using the semiconductor light source apparatus having a substantially uniform light-emitting color tone, which can be used for various lighting units such as general lighting, a stage light, a street light, a projector, a vehicle lamp, etc.

According to one aspect of the disclosed subject matter, a semiconductor light source apparatus can include: a substrate having a mounting surface; at least one phosphor layer disposed on the mounting surface of the substrate via an adhesive material, and the at least one phosphor layer composed of at least one of a glass phosphor and a phosphor ceramic which include substantially no resin component; a polarizer located adjacent to the at least one phosphor layer; and a semiconductor light source emitting blue light having a field vector through the polarizer, an optical axis of the semiconductor light source intersecting with the mounting surface of the substrate at an angle between 0 degrees and 90 degrees, a light-emitting area of the semiconductor light source being located on the at least one phosphor layer to wavelength-convert the blue light emitted from the semiconductor light source by the at least one phosphor layer, and the semiconductor light source being configured such that the blue light emitted from the semiconductor light source travelling along the optical axis changes direction toward the at least one phosphor layer after being reflected from at least one of the substrate and the adhesive material, wherein the field vector of the blue light becomes substantially parallel with an imaginary plane which connects an incident direction of the blue light directed toward the at least one phosphor layer to a normal line of an incident surface on the at least one phosphor layer of the blue light.

In this case, when the semiconductor light source emits a blue laser light having a field vector, the semiconductor light source apparatus does not necessarily need the polarizer.

In the above-described exemplary light source apparatus, an incident angle of the blue light with respect to the at least one phosphor layer can be more than arctangent ((a refraction index of the at least one phosphor layer $n2-0.5$)/$n1$) and can be less than arctangent ((the refraction index of the at least one phosphor layer $n2+0.5$)/$n1$), when a refraction index of a matter located on the at least one phosphor layer is referred to as $n1$, so that the blue light can efficiently enter into the phosphor layer without a mirror reflection on the phosphor layer. Additionally, the at least one phosphor layer can be selected from the group consisting of (or comprising) a yellow phosphor ceramic, and two phosphor layers of a red phosphor layer and a green phosphor layer, and also can be a translucent YAG phosphor ceramic, in order to be able to emit various color lights including light having a substantially white color tone.

According to the above-described exemplary semiconductor light source apparatuses, the at least one phosphor layer is located on the substrate via the adhesive material and does not include a substantially resin component, and the blue light can enter into the at least one phosphor layer so as not to be mirror-reflected on the phosphor layer. Accordingly, even when a high power semiconductor light-emitting device is used under a large current as the semiconductor light source, the blue excitation light emitted from the high power semiconductor light-emitting device can be efficiently wavelength-converted by the at least one phosphor layer without a reduction of light intensity, and can be emitted while the light maintains a substantially uniform light-emitting color tone. Thus, the semiconductor light source apparatuses can emit various color lights including white light having high brightness and a substantially uniform color tone.

According to another aspect of the disclosed subject matter, a lighting unit including a semiconductor light source apparatus according to one embodiment can further include a housing located adjacent to cover the semiconductor light source apparatus and a projector lens having an optical axis located adjacent to the housing so that the optical axis of the projector lens substantially corresponds to the optical axis of the semiconductor light source.

In this case, the lighting units including the semiconductor light source apparatus can include the projector lens to form a light distribution in accordance with various usages. Thus, the disclosed subject matter can provide high power lighting units having high brightness and a favorable light distribution with a substantial light-emitting color tone, which can be used for various lighting units such as general lighting, stage lighting, a street light, a projector, a vehicle lamp, etc.

BRIEF DESCRIPTION OF THE DRAWINGS

These and other characteristics and features of the disclosed subject matter will become clear from the following description with reference to the accompanying drawings, wherein:

FIG. 1b is a schematic top view showing a phosphor layer of the first embodiment of the semiconductor light source apparatus shown in FIG. 1a;

FIG. 5b is a schematic top view showing a phosphor layer of the second embodiment of the semiconductor light source apparatus shown in FIG. 5a;

FIG. 7 is a schematic structural view showing an exemplary variation of the phosphor layer in the embodiment of the semiconductor light source apparatus shown in FIG. 1a;

FIG. 8 is a schematic structural view showing an exemplary variation of the phosphor layer in the embodiment of the semiconductor light source apparatus shown in FIG. 5a;

DETAILED DESCRIPTION OF EXEMPLARY EMBODIMENTS

Figure 1A:
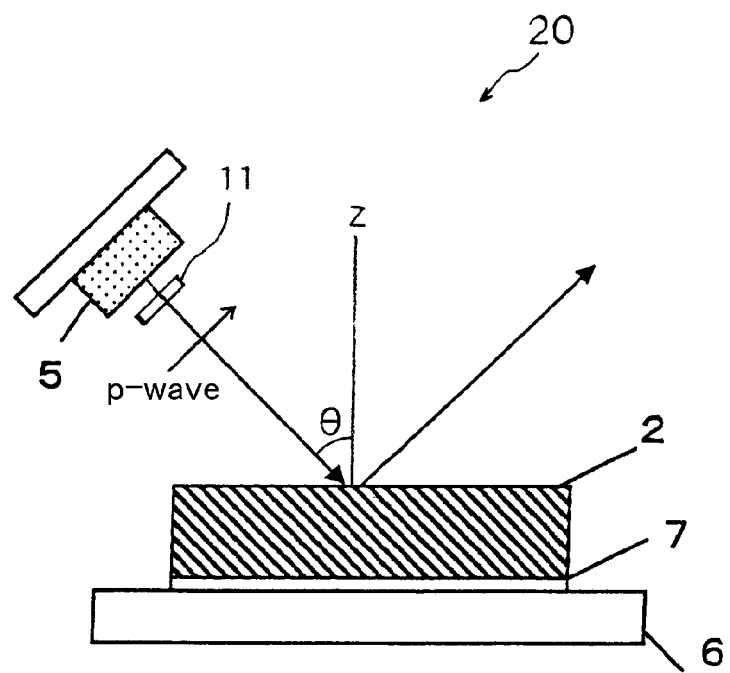
FIG. 1a is a schematic structural view showing a first exemplary embodiment of a semiconductor light source apparatus made in accordance with principles of the disclosed subject matter.
Figure 1B:
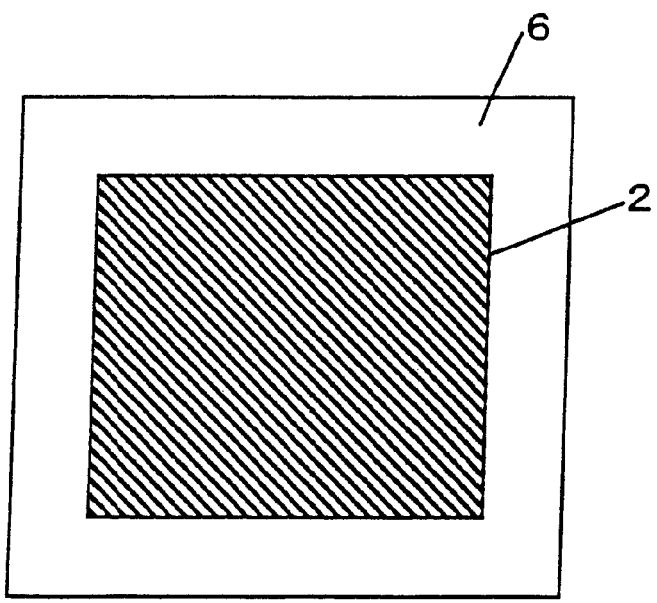

The disclosed subject matter will now be described in detail with reference to FIGS. 1 to 13, in which the same or corresponding elements use the same reference marks. FIG. 1a is a schematic structural front view showing an exemplary embodiment of a semiconductor light source apparatus made in accordance with principles of the disclosed subject matter, and FIG. 1b is a schematic top view showing a phosphor layer of the embodiment of the semiconductor light source apparatus of FIG. 1a.

The semiconductor light source apparatus 20 can include a semiconductor light source 5 configured to emit a visible light as excitation light and being an light emitting diode (LED) or a semiconductor laser such as a laser diode, and a phosphor layer 2 including at least one phosphor to wavelength-convert the visible light emitted from the semiconductor light source 5 into an excited light having a longer light-emitting wavelength than that of the light emitted from the semiconductor light source 5 and being located away from the semiconductor light source 5. The phosphor layer 2 may not include a substantial amount of resin component, and may include no resin component at all (i.e., may include substantially no resin component).

The semiconductor light source 5 can also be located adjacent to the phosphor layer 2 so that the excitation light emitted from the semiconductor light source 5 can enter into the phosphor layer 2, and a radiating substrate 6 can be located on the opposite side of the semiconductor light source 5. The phosphor layer 2 can be attached to the radiating substrate 6 via an adhesive material 7, which is composed of a material having a high thermal conductivity and a high reflectivity as described later. The radiating substrate 6 can also be used as a reflector, which reflects the excited light of the phosphor layer 2 excited by the excitation light in a direction toward the phosphor layer 2.

Figure 14:
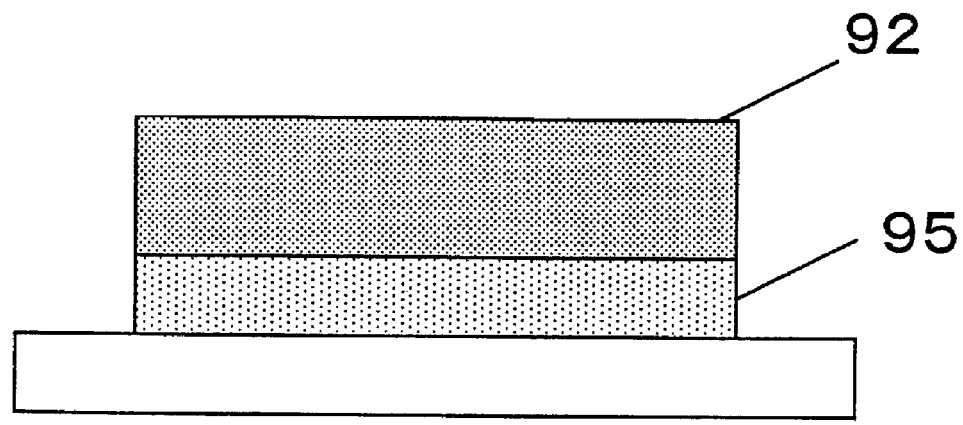
FIG. 14 is a schematic structural view showing a conventional semiconductor light source apparatus using a phosphor ceramic layer that includes a phosphor particle without a transparent resin.
Figure 15A:
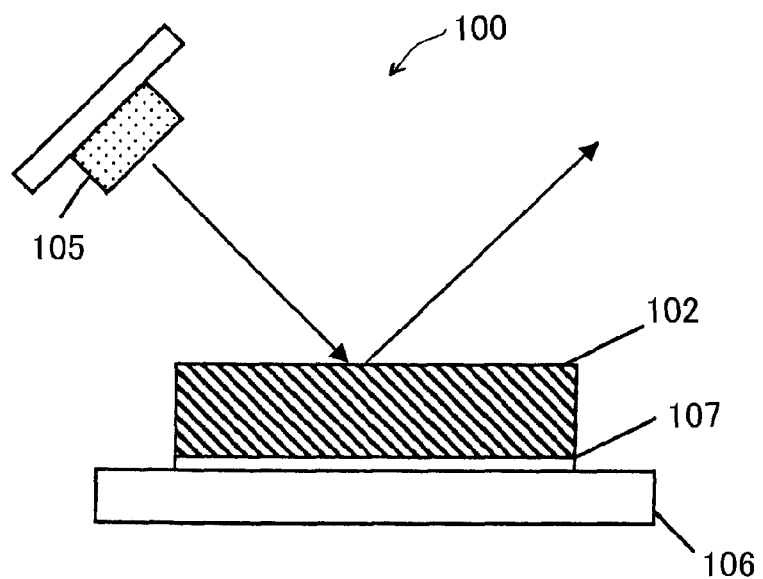
FIGS. 15a and 15b are a schematic front view and a top view, respectively, showing another conventional semiconductor light source apparatus of a reflective type.
Figure 15B:
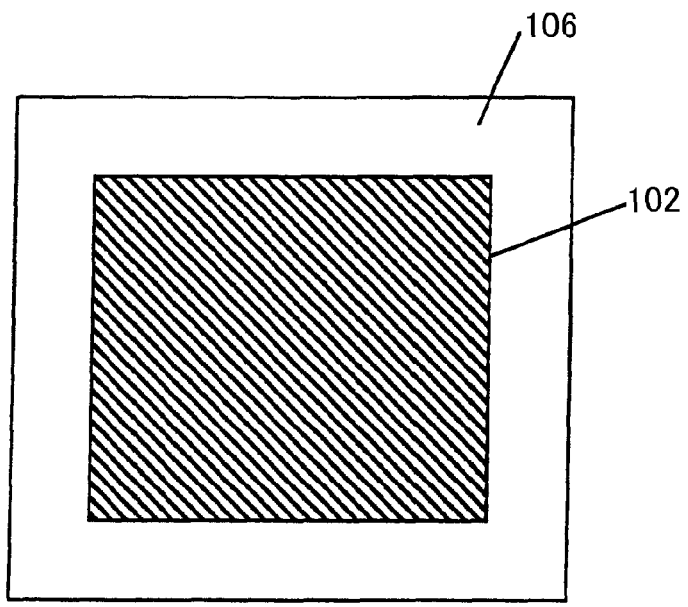
Figure 16:
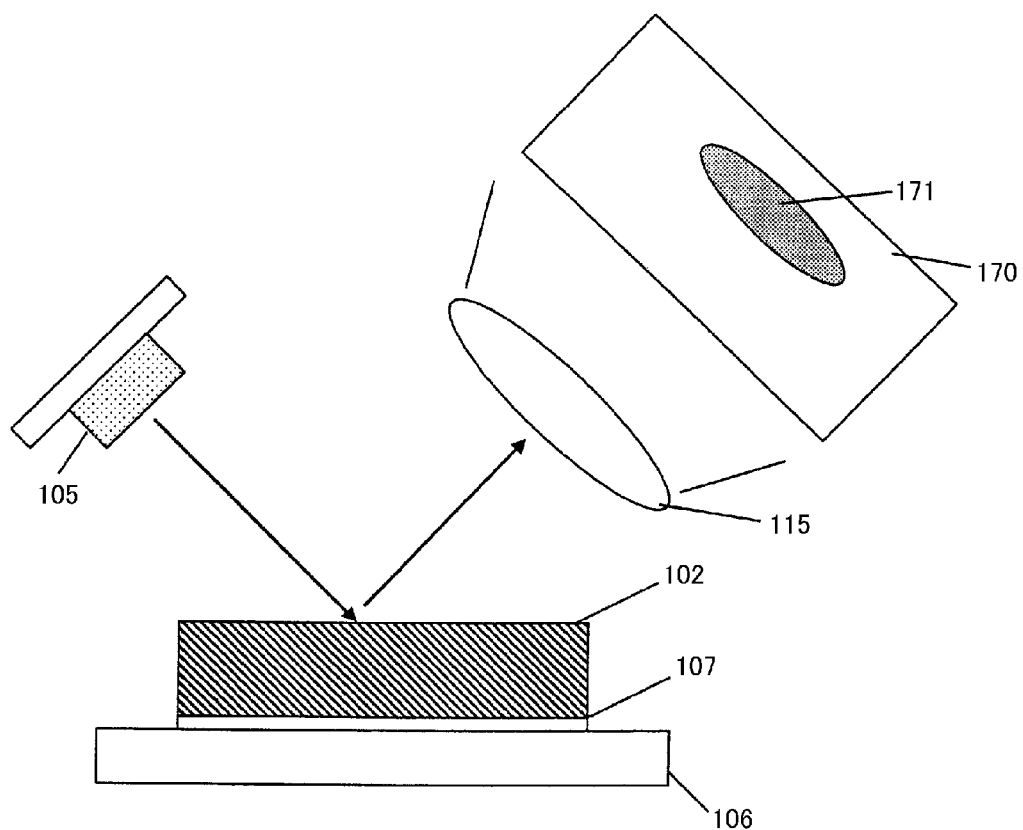
FIG. 16 is an explanatory drawing showing a light-emitting color variability, which may be caused by the other conventional semiconductor light source apparatus shown in FIGS. 15a and 15b.

Therefore, the semiconductor light source apparatus 20 can emit a wavelength converted light via at least one of the radiating substrate 6 and the adhesive material 7 as a reflection type light source apparatus in common with the conventional light source apparatus 100 shown in FIG. 15a. However, because the conventional light source apparatus shown in FIG. 14 is a transmission type light source apparatus, the semiconductor light source 95 is located between the phosphor ceramic layer 92 and the mounting substrate. Accordingly, the radiating efficiency of the phosphor ceramic layer 92 may be low because the phosphor ceramic layer 92 is located on the semiconductor light source 95, which generates a large amount of heat.

In contrast, in the semiconductor light source apparatus 20 of the disclosed subject matter, the semiconductor light source 5 can be located away from the phosphor layer 2. In addition, because the phosphor layer 2 can be located on the radiating substrate 6 via the adhesive material 7 having a high thermal conductivity, even when the semiconductor light source 5 transmits a large amount of heat to the phosphor layer 2 by allowing a large current to flow in the semiconductor light source 5 for purpose of the super high-intensity lighting, the heat of the phosphor layer 2 can be radiated from the radiating substrate 6 via the adhesive material 7.

Moreover, in the conventional light source apparatus shown in FIG. 14, because light reflected underneath the phosphor ceramic layer 92 may be absorbed in the semiconductor light source 95, the light use efficiency may decrease. Furthermore, a thickness of the phosphor ceramic layer 92 needs to be increased in order to emit light having a predetermined chromaticity because the conventional light source apparatus is a transmission type light source apparatus. Accordingly, it may become more difficult for the conventional light source apparatus to radiate the heat of the phosphor ceramic layer 92 from the mounting substrate via the semiconductor light source 95.

On the other hand, because the semiconductor light source apparatus 20 shown in FIG. 1a can reflect light emitted from the semiconductor light source 5 via at least one of the radiating substrate 6 and the adhesive material 7, the light emitted from the semiconductor light source 5 can scarcely be absorbed between the phosphor layer 2 and the radiating substrate 6. Accordingly, the light use efficiency of the semiconductor light source 5 can be maintained in a high state. In addition, the reflection type semiconductor light source apparatus 20 can allow a reduction in the thickness of the phosphor layer 2 because light path lengths in the phosphor layer 2 can become long. Therefore, the radiating efficiency of the phosphor layer 2 can improve due to a thin phosphor layer.

Moreover, because the phosphor layer 2 does not include a substantially resin component, or includes no resin component, a tarnish of the phosphor layer 2 is not caused by a radiating heat transmitted from the semiconductor light source 5 even if the semiconductor light source 5 generates a large amount of radiating heat. Accordingly, a semiconductor light source apparatus 20 that can emit light having high brightness can be realized.

The phosphor layer 2 that does not include a substantial amount of a resin component means that the resin component for forming the phosphor layer 2 is, for example, 5 wt percentages or less in the phosphor layer 2. As indicated above, the at least one phosphor layer 2 can comprise, consist essentially of, or consist of, at least one of a glass phosphor, which is made by dispersing a phosphor powder in a glass and by adding a light-emitting ion into a glass, and a phosphor ceramic such as a single crystal phosphor, a poly crystal phosphor, etc.

The phosphor ceramic can be made by forming a phosphor in a predetermined shape and by burning the phosphor in a manufacturing process. In the case, even when an organic material is used as a binder in the manufacturing process for the phosphor layer 2, because the organic component is burnt in a degreasing process after the forming process, the phosphor ceramic can include only the resin component of 5 wt percentages or less.

Therefore, because the above-described phosphor layer 2 does not include a substantial resin component and can be composed of only inorganic materials, tarnish is prevented in the phosphor layer 2 due to the heat generated from the semiconductor light source 5. In addition, the glass phosphor can have a high thermal conductivity in general, and therefore the radiating efficiency of the phosphor layers 2 that is composed of the glass phosphor can become high. Moreover, because the phosphor ceramic can generally have a higher thermal conductivity than that of the glass phosphor and a manufacturing cost for the poly crystal phosphor ceramic may be lower than that for the single crystal phosphor ceramic, the poly crystal phosphor ceramic can be used as the phosphor layer 2.

The phosphor layer 2 can include at least one phosphor that wave-converts the excitation light emitted from the semiconductor light source 5 into light having a prescribed wavelength. Specifically, when the semiconductor light source 5 emits blue light as the visual excitation light, the phosphor layer 2 can include at least one of, for example, a green phosphor, a red phosphor and a yellow phosphor.

When the semiconductor light source 5 emits the blue excitation light and when the phosphor layer 2 includes the red phosphor wavelength-converting the blue light into purple light and the green phosphor wavelength-converting the blue light into blue-green light, then the semiconductor light source apparatus 20 can emit substantially white light as a reflective light emitted from the phosphor layer 2 due to an additive color mixture using lights of the two phosphors excited by the blue excitation light and a part of the blue light that is not excited by the phosphors.

In addition, when the phosphor layer 2 includes a yellow phosphor wavelength-converting the blue light into yellow light and when the semiconductor light source 5 emits the blue light as the excitation light, the semiconductor light source apparatus 20 can also emit substantially white light due to an additive color mixture using the yellow light of the yellow phosphor excited by the blue excitation light and a part of the blue light that is not excited by the yellow phosphor.

The radiating substrate 6 can operate as the radiator, which radiates heat generated from the phosphor layer 2 while the phosphor layer 2 is attached thereto, and also can operate as a reflector that reflects light emitted from the phosphor layer 2 excited by the excitation light, and that part of the excitation light not excited by the phosphor layer 2 if the adhesive material 7 is transparent. Accordingly, a metallic substrate such as aluminum, an oxide ceramic such as an alumina and a non oxide ceramic such as an aluminum nitride can be used as the radiating substrate 6 because these materials have a high reflectivity, a high thermal conductivity and a high workability.

As the adhesive material 7 for attaching the phosphor layer 2 to the radiating substrate 6, an organic adhesive material, an inorganic adhesive material, a low-melting-point glass, and/or a metallic brazing can be used. For example, a silver brazing having a high reflectivity and a high thermal conductivity can be used as the adhesive material 7.

Principles for reducing the light-emitting color variability in the semiconductor light source apparatus 20 will now be described in detail with reference to FIGS. 2 to 4c. The semiconductor light source apparatus 20 can also include a polarizer 11 between the semiconductor light source 5 and the phosphor layer 2 so that light emitted from the semiconductor light source 5 can enter into the phosphor layer 2 through the polarizer 11. For the polarizer 11, a glass polarizer, Glan polarizer, a film polarizer and the like can be used.

The polarizer 11 can polarize the excitation light emitted from the semiconductor light source 5 so that a field vector of the excitation light becomes substantially parallel with an imaginary plane, which connects an incident direction of the excitation light directed toward the phosphor layer 2 to a normal line Z of an incident surface on the phosphor layer 2 of the excitation light. That is to say, the polarizer 11 can polarize the excitation light so as to create the p-wave, and the polarized light of the p-wave can enter into the phosphor layer 2 at an incident angle θ with respect to the normal line Z, as shown in FIG. 1.

When an LED is used as the semiconductor light source 5, because light emitted from the LED includes various field vectors, the semiconductor light source 5 can emit the polarized light as the excitation light toward the phosphor layer 2 by locating the polarizer 11 between the semiconductor light source 5 and the phosphor layer 2. More specifically, by locating the polarizer 11 adjacent to the semiconductor light source 5 so that the polarized light of the p-wave can be emitted as the excitation light toward the phosphor layer 2, the phosphor layer 2 can receive the excitation light such that it becomes substantially parallel with the imaginary plane, which connects the incident direction of the excitation light directed toward the phosphor layer 2 to a normal line Z of an incident surface on the phosphor layer 2 of the excitation light.

Figure 2:
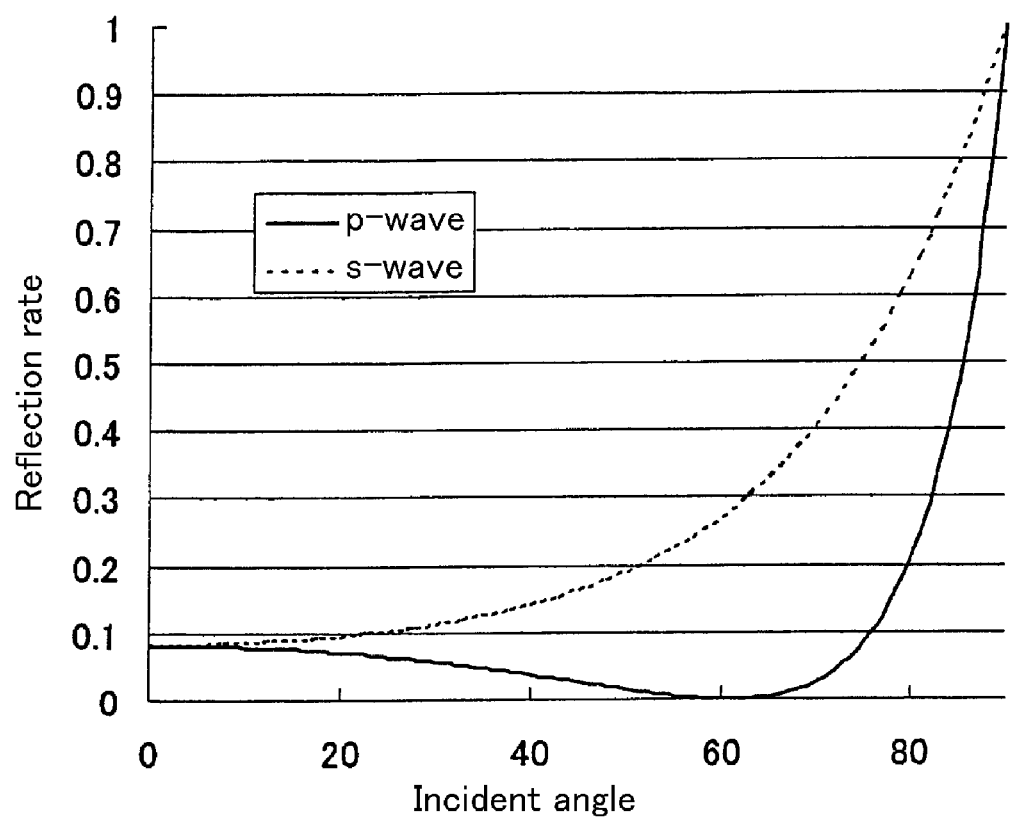
FIG. 2 is a graph showing a relationship between an incident angle of an excitation light entered into the phosphor layer and a reflection rate with respect to the incident angle.

FIG. 2 is a graph showing a relationship between the incident angle θ of the excitation light entered into the phosphor layer 2 and a reflection rate with respect to the incident angle. The reflection rate of the p-wave is generally lower than that of s-wave, which has a field vector perpendicular to the field vector of the p-wave. Especially, the reflection rate of the p-wave becomes nearly zero near the incident angle of 60 degrees, and is less than approximately 0.05 even at the incident angle θ in the range of 30 to 70 degrees.

When a refraction index of matter located on the phosphor layer 2 in an incident direction of the excitation light is referred to as n1 and the refraction index of the phosphor layer 2 is referred to as n2, the reflection rate of the polarized light of p-wave can be 1 percent or less, if the incident angle θ satisfies the following formula 1.

$$\text{arctangent}\,((n2-0.5)/n1) < \theta < \text{arctangent}\,((n2+0.5)/n1) \quad \text{Formula 1}$$

That is because a light-emitting color variability, which is caused by mirror-reflecting of the excitation light emitted from the semiconductor light source 5 on a top surface of the phosphor layer 2, can be prevented due to a bare reflection rate of the p-wave of 1 percent or less. In FIG. 2, n2 is approximately 1.8, and the reflection rate of the polarized light of p-wave becomes 1 percent or less near the incident angle of 60 degrees. Thus, the semiconductor light source apparatus 20 cannot cause light-emitting color variability if the incident angle of the excitation light emitted from the semiconductor light source 5 is maintained at approximately 60 degrees.

Figure 3:
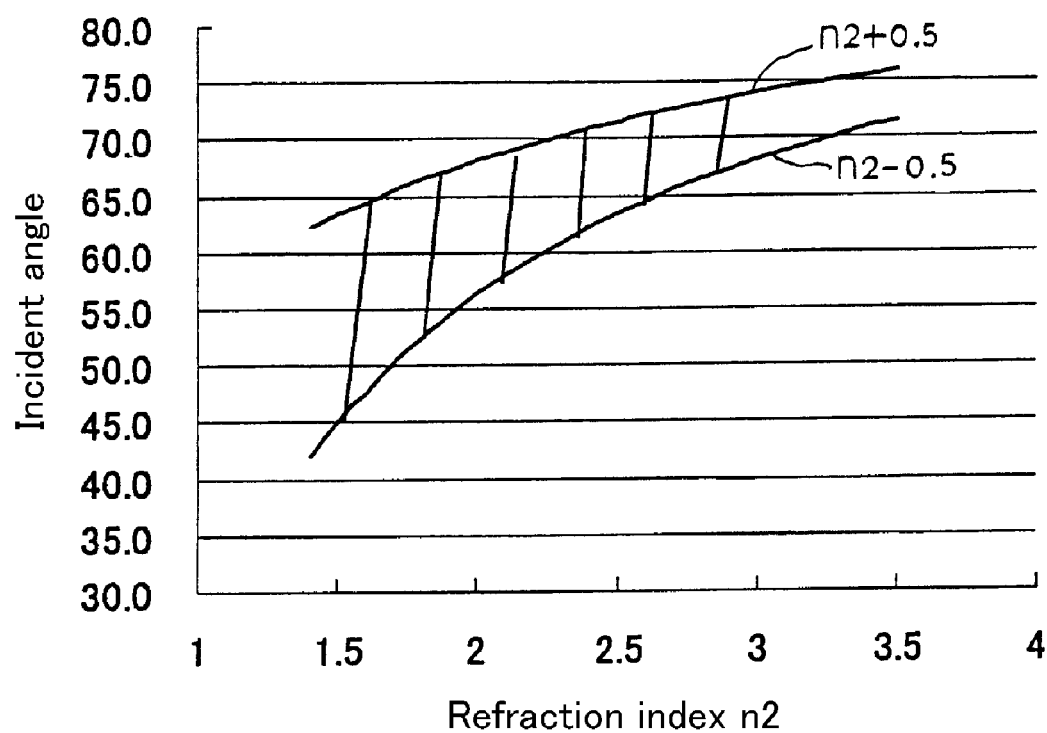
FIG. 3 is a graph depicting a range of the incident angle when the reflection rate of the p-wave in the excitation light entered into the phosphor layer becomes one percent or less.

FIG. 3 is a graph depicting a range of the incident angles where the reflection rate of the p-wave in the excitation light entering into the phosphor layer 2 becomes one percent or less. As the incident angle becomes small, the range of the incident angle where the reflection rate of p-wave becomes one percent or less becomes wide. Accordingly, when the above-described n2 is approximately 1.8, the semiconductor light source apparatus 20 cannot cause light-emitting color variability if the incident angle of the excitation light is maintained in the range of approximately 53 to 67 degrees.

Figure 4A:
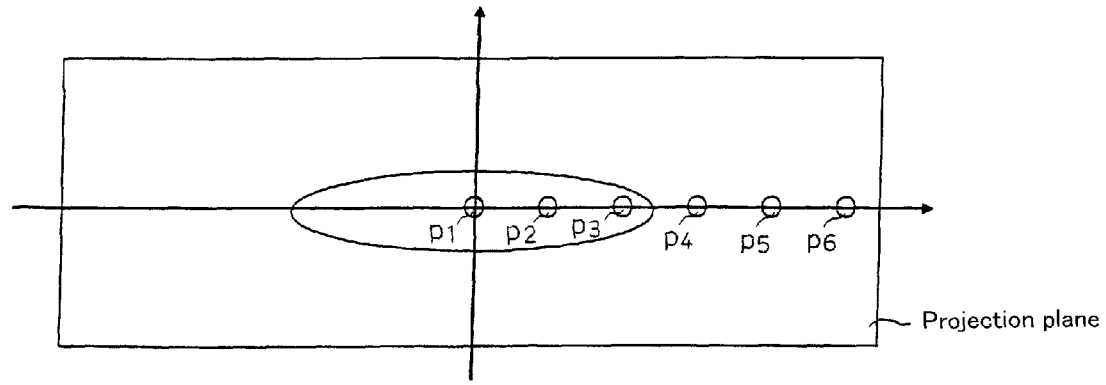
FIG. 4a is a front view showing an exemplary projection pattern of a light-emitting color variability and measurement points P1-P6 of chromaticity values on a projection plane.
Figure 4B:
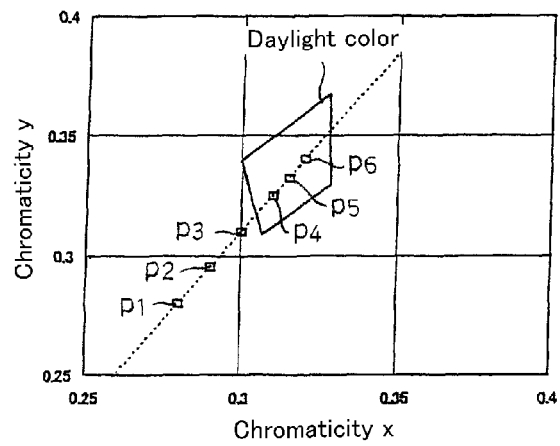
FIG. 4b is a chromaticity diagram showing chromaticity values at the measurement points P1-P6 when the incident angle of the excitation light does not satisfy formula 1.

FIG. 4a shows a projection plane, on which an exemplary projection pattern of a light-emitting color variability and measurement points P1-P6 of chromaticity values are shown when the incident angle θ is out of range of the inequality formula 1, and FIG. 4b is a chromaticity diagram showing the chromaticity values at the measurement points P1-P6. In the case, a blue LED emitting blue excitation light is use as the semiconductor light source 5, and a YAG phosphor ceramic is used as the phosphor layer 2 in order to emit light having a daylight color tone.

When the incident angle θ does not satisfy the inequality formula 1, an ellipsoidal light distribution pattern occurs in the middle section of the projection plane by mirror-reflecting a small part of the blue excitation light on the top surface of the phosphor layer 2 and by enlarged-projecting the small part of the blue excitation light, as shown in FIG. 4a.

In this case, because the ellipsoidal light distribution pattern includes a pale blue color tone that widely enlarges the small part of the blue excitation light, chromaticity values at the measurement points P1-P3 located on the ellipsoidal light distribution pattern causes a light-emitting color variability in a direction toward the blue region in a chromaticity coordinate as shown in FIG. 4b, although chromaticity values at the measurement points P4-P6 are located on a daylight color region because the measurement points P4-P6 are located out of the ellipsoidal light distribution pattern.

In addition, a chromaticity value at the measurement point P1 includes a mostly blue color tone among the chromaticity values at the measurement points P1 to P6, because the measurement point P1 is located at a central point of the ellipsoidal light distribution pattern projected by the mirror reflection of the small part of the blue excitation light. Moreover, because the chromaticity values at the measurement points P1-P6 spread in the chromaticity coordinate, the semiconductor light source apparatus may not emit light having a uniform daylight color tone.

Figure 4C:
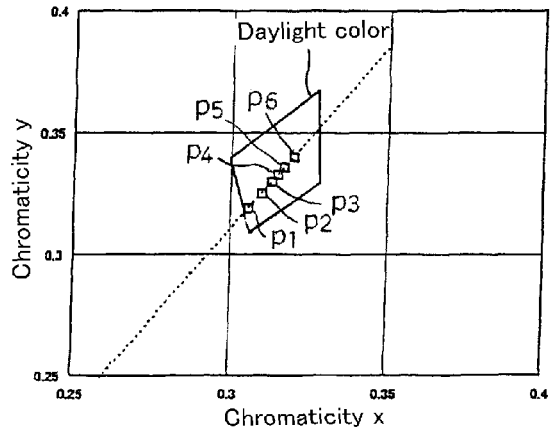
FIG. 4c is a chromaticity diagram showing the chromaticity values at the measurement points P1-P6 when the incident angle of the excitation light satisfies formula 1.

FIG. 4c is a chromaticity diagram showing the chromaticity values at the measurement points P1-P6 when the incident angle satisfies the inequality formula 1. In this case, even though the measurement points P1-P6 widely spread on the projection plane, all the chromaticity values at the measurement points P1-P6 can be located on the daylight color region. Therefore, when the incident angle θ can satisfy the inequality formula 1, the semiconductor light source apparatus can emit light having a substantially uniform color tone while preventing the excitation light from a mirror reflection on the phosphor layer 2.

As described above, the semiconductor light source apparatus 20 can substantially reduce the color variability caused by the mirror reflection of the excitation light, by locating the polarizer 11 adjacent to the semiconductor light source 5 so that the phosphor layer 2 can receive the polarized light of the p-wave as the excitation light such that it becomes substantially parallel with the imaginary plane, which connects the incident direction of the excitation light directed toward the phosphor layer 2 to the normal line Z of the incident surface on the phosphor layer 2 of the excitation light, and by setting up the incident angle of the excitation light toward the phosphor layer 2 so that the incident angle θ of the excitation light can satisfy the inequality formula 1.

Figure 5A:
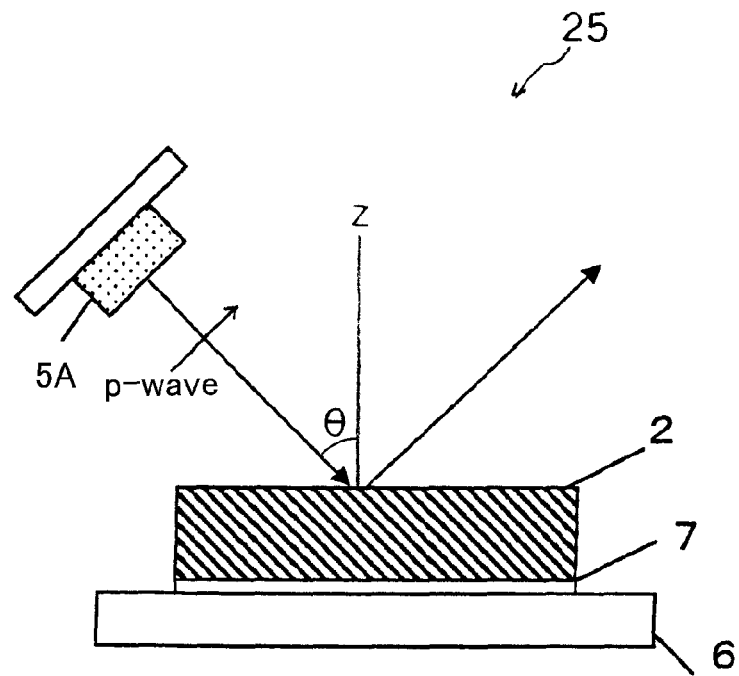
FIG. 5a is a schematic structural view showing a second exemplary embodiment of a semiconductor light source apparatus made in accordance with principles of the disclosed subject matter.

Another embodiment of a semiconductor light source apparatus of the disclosed subject matter will now be described with reference to FIGS. 5a to 6. FIG. 5a is a schematic structural view showing another exemplary embodiment of a semiconductor light source apparatus made in accordance with principles of the disclosed subject matter, and FIG. 5b is a schematic top view showing a phosphor layer of the embodiment of the semiconductor light source apparatus shown in FIG. 5a.

Figure 5B:
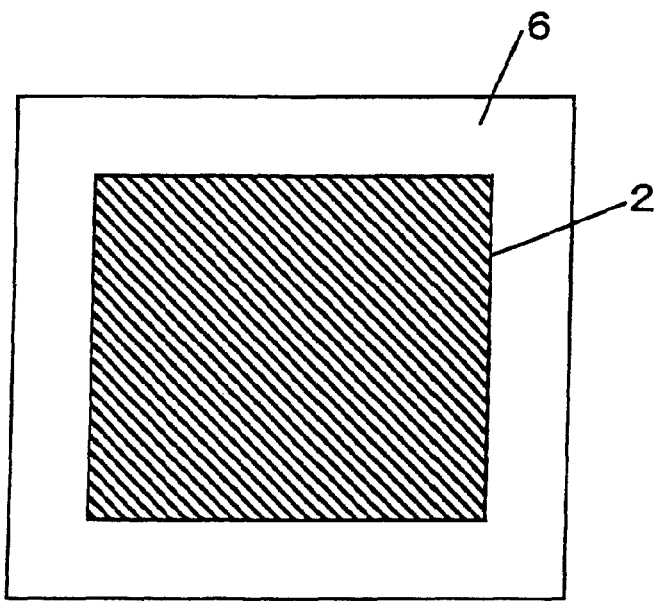
Figure 6:
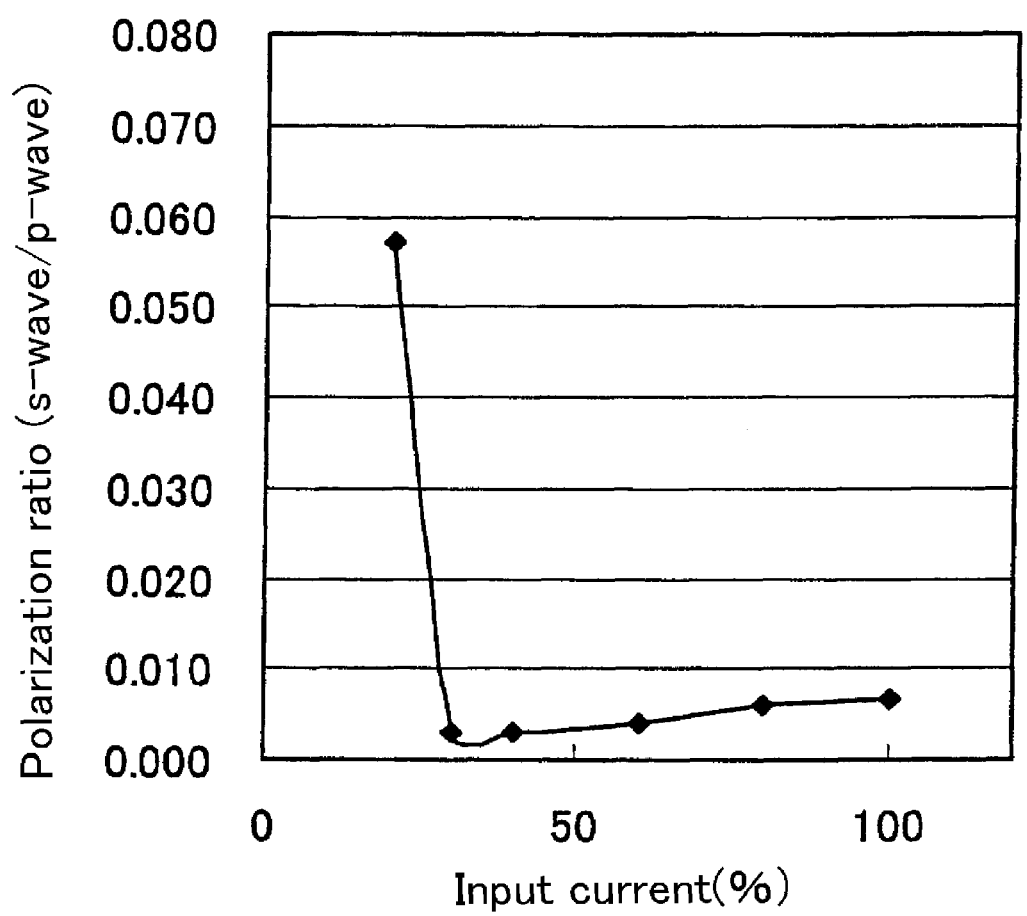
FIG. 6 is a graph showing a relationship of a polarization ratio of s-wave/p-wave and an input current with respect to a rated current of a semiconductor laser when the semiconductor laser is used as a semiconductor light source.

A difference between the embodiment of FIGS. 5a and 5b and the embodiment shown in FIGS. 1a and 1b relates to the semiconductor light source 5A, while the other structures are basically the same. In the embodiment of FIGS. 1a and 1b, because light emitted from the LED includes various field vectors, the semiconductor light source 5 emits the polarized light of the -wave as the excitation light by locating the polarizer 11 between the semiconductor light source 5 and the phosphor layer 2.

In the embodiment of FIGS. 5a and 5b, when the semiconductor laser is used as the semiconductor light source 5A, if the semiconductor laser emits substantially coherent light corresponding to the polarized light of the p-wave, the semiconductor light source apparatus 25 of this embodiment can employ a semiconductor laser as the semiconductor light source 5 without the polarizer 11, which is used to polarize light emitted from the semiconductor light source 5 in the embodiment of FIGS. 1a and 1b.

In the case of the embodiment of FIGS. 5 and 5b, the semiconductor light source apparatus 25 can be provided with a semiconductor light source 5A so that the phosphor layer 2 can receive the excitation light emitted from the semiconductor laser such that it becomes substantially parallel with an imaginary plane, which connects an incident direction of the excitation light directed toward the phosphor layer 2 to a normal line Z of an incident surface on the phosphor layer 2 of the excitation light.

FIG. 6a is a graph showing a relationship of a polarization ratio of s-wave/p-wave and an input current (percentage) with respect to a rated current of the semiconductor laser when the semiconductor laser is used as the semiconductor light source 5A. In this case, if the input current is more than 30 percentage of the rated current, because the polarization ratio is less than 1 percentage, substantially only the p-wave can be emitted from the semiconductor light source 5A without the polarizer 11 in common with the earlier embodiment of FIGS. 1a and 1b. If the polarization ratio of laser light emitted from a semiconductor laser is not low (e.g., more than 5 percentages), the semiconductor laser can also be used as the semiconductor light source 5 with the polarizer 11 in common with the =embodiment of FIGS. 1a and 1b.

Thereby, the phosphor layer 2 of the semiconductor light source apparatus 25 can also receive the excitation light similar to the p-wave by locating the semiconductor light source 5A so that laser light emitted from the semiconductor light source 5A becomes substantially parallel with the imaginary plane, which connects the incident direction of the excitation light directed toward the phosphor layer 2 to a normal line Z of an incident surface on the phosphor layer 2 of the excitation light.

In addition, the semiconductor light source 5A can be located toward the phosphor layer 2 so that the incident angle θ of the excitation light can satisfy the inequality formula 1 in common with the embodiment of FIGS. 1a and 1b, and thereby the reflection rate of the excitation light on the phosphor layer 2 can be less than 1 percentage. Therefore, the semiconductor light source apparatus 25 can substantially reduce a color variability caused by the mirror reflection of the excitation light without the polarizer 11 used for the embodiment of FIGS. 1a and 1b.

As described above, the semiconductor light source apparatus 25 of the embodiment of FIGS. 5a and 5b can also provide a light distribution pattern having a substantially uniform color tone by reducing the mirror reflection of the excitation light on the phosphor layer 2, using the semiconductor laser so that the incident angle θ of the excitation light emitted from the semiconductor laser can satisfy the inequality formula 1.

Figure 7:
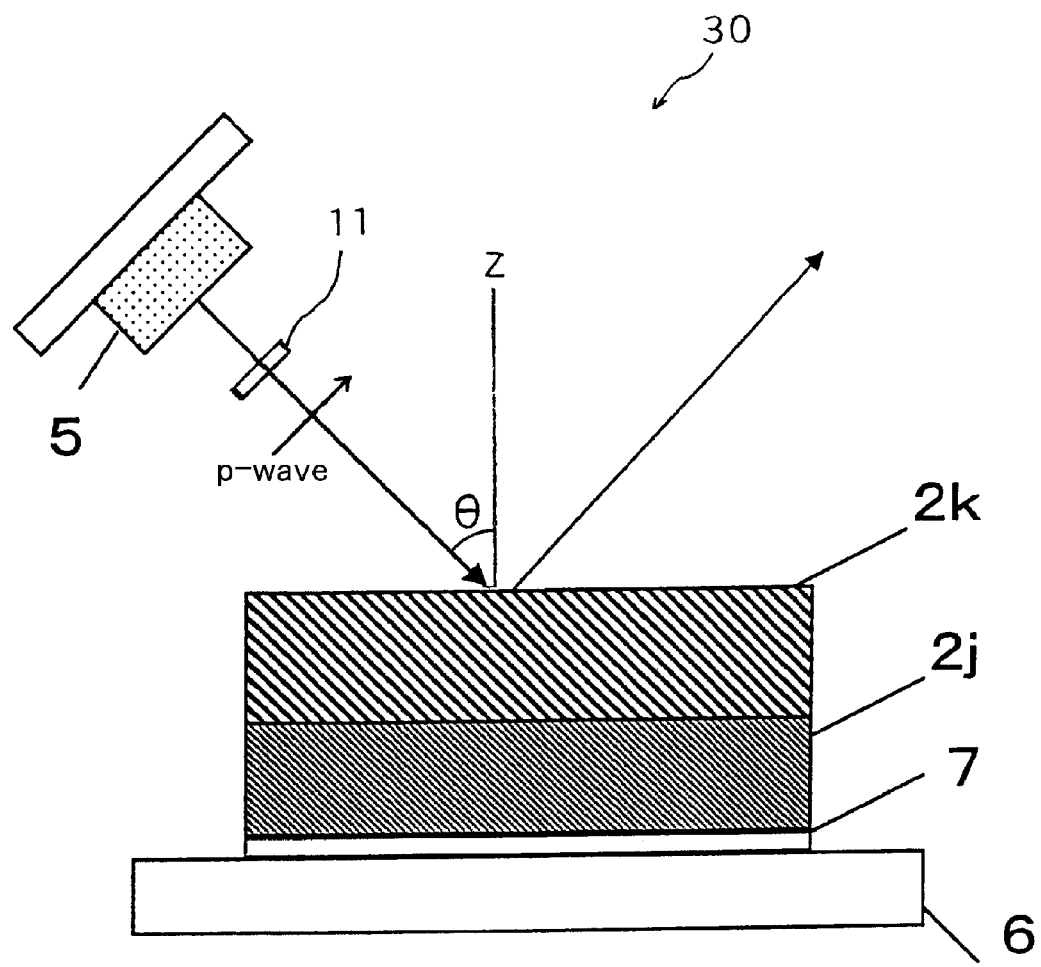
Figure 8:
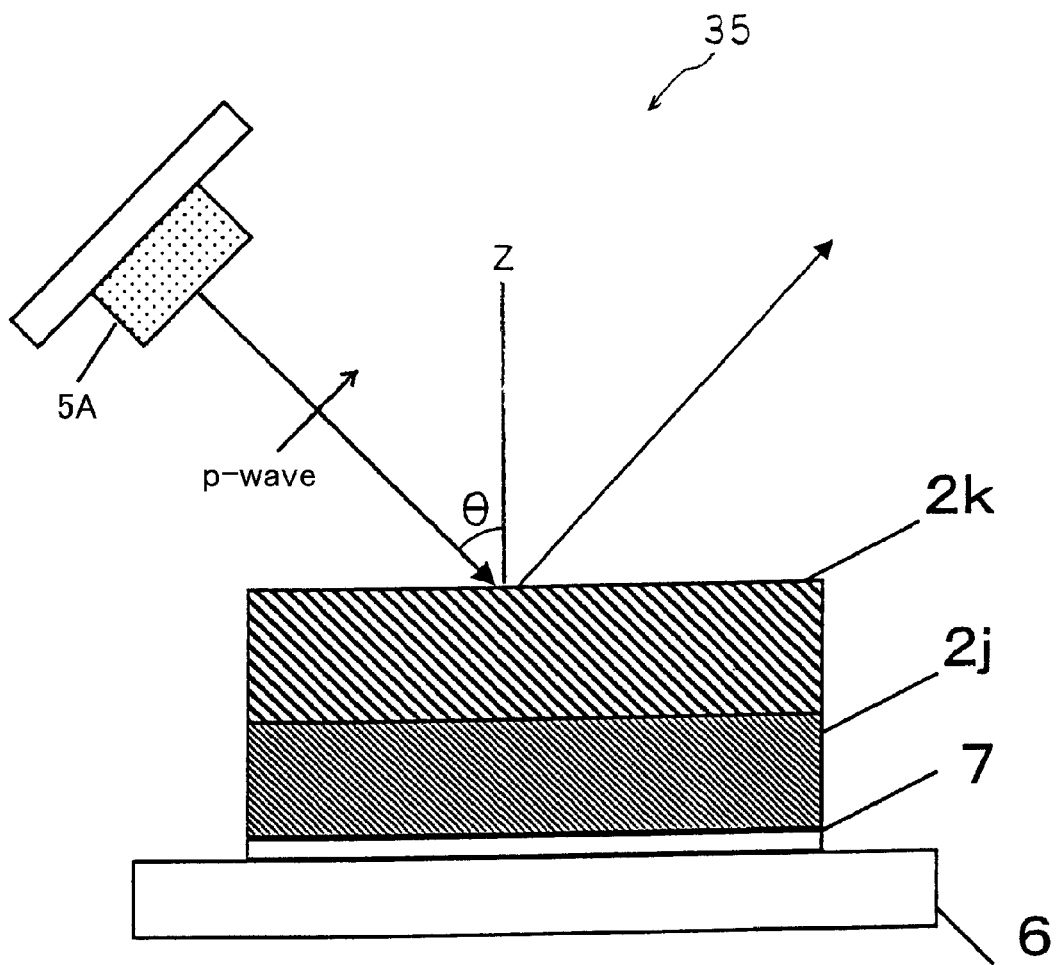
Figure 9:
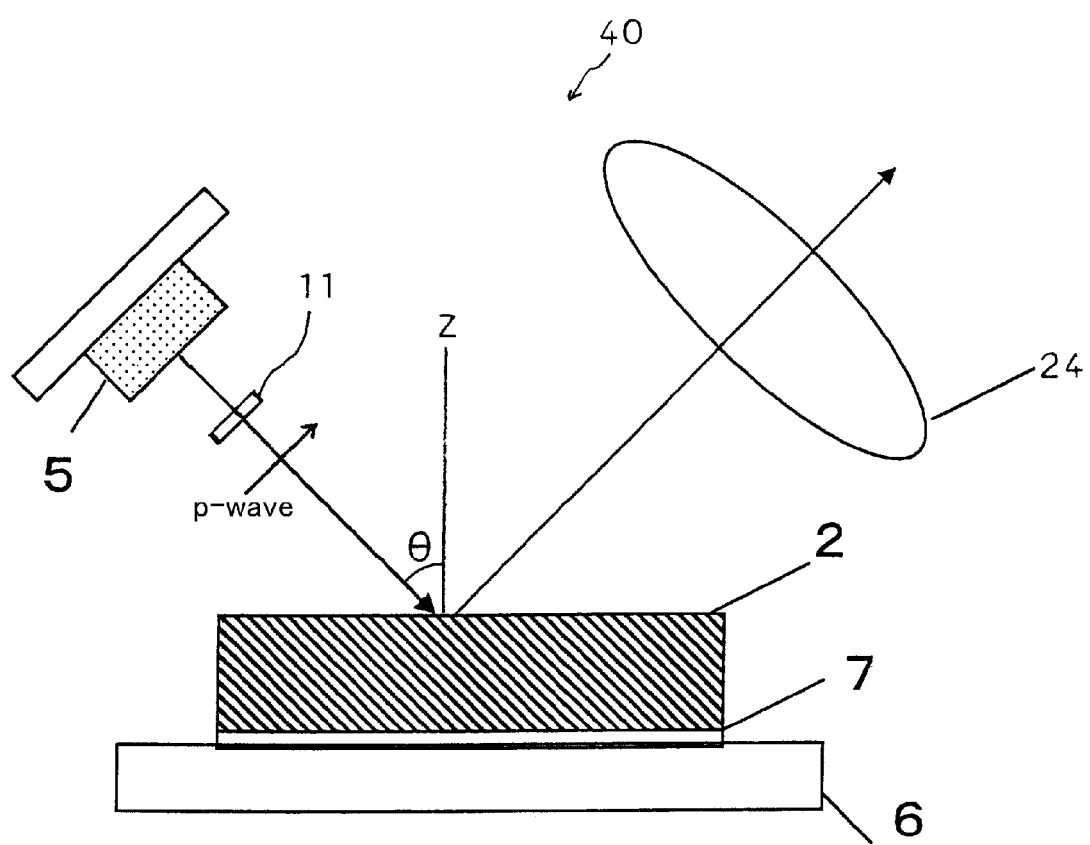
FIG. 9 is a schematic basic structural view showing an exemplary embodiment of a lighting unit using the semiconductor light source apparatus of FIG. 1a made in accordance with principles of the disclosed subject matter.

FIGS. 7 and 8 are schematic structural views showing an exemplary variation of the phosphor layer in the embodiment of FIG. 1a and the embodiment of FIG. 5a of the semiconductor light source apparatuses, respectively. The phosphor layer 2 of each of these embodiments can be replaced with a first phosphor layer 2j and a second phosphor layer 2k, and a plurality of phosphor layers can be formed as the phosphor layer 2.

For example, when the semiconductor light source of each of these embodiments emits blue light as the excitation light, each of semiconductor light source apparatuses 30 and 35 of FIGS. 7 and 8 can emit light having a substantially uniform white color tone as a reflection light emitted from the two phosphor layers, by forming a green phosphor as the first phosphor layer 2j and by forming a red phosphor layer as the second phosphor layer 2k, because of an additive color mixture using lights of the two phosphors excited by the blue excitation light and a part of the blue light that is not excited by the phosphors.

The semiconductor light sources 5 and 5A and the phosphor layer 2 of the above-described semiconductor light source apparatuses 20, 25, 30 and 35 will now be described in detail. As the semiconductor light source 5 of each of the light source apparatuses 20 and 30 shown in FIGS. 1a and 7, an LED emitting a visible light can be used, and a laser diode having a wavelength of a visible light can be used as the semiconductor light source 5A of each of the light source apparatuses 25 and 35 shown in FIGS. 5a and 8.

More specifically, as the semiconductor light source 5 of each of the light source apparatuses 20 and 30, an LED of InGaN series that emits blue light having a light-emitting wavelength of approximately 460 nanometers can be used. As the semiconductor light source 5A of each of the light source apparatuses 25 and 35, an LED of InGaN series that emits laser light having a light-emitting wavelength of approximately 460 nanometers can be used.

In these cases, as the red phosphor of the phosphor layer 2, which is excited by the blue excitation light having a light-emitting wavelength of approximately 440 to 470 nanometers, $CaAlSiN_3$: $Eu^{2+}$, $Ca_2Si_5N_8$: $Eu^{2+}$, $KSiF_6$: $Mn^{4+}$, $KTiF_6$: $Mn^{4+}$ and the like can be used. As the green phosphor of the phosphor layer 2, $Y_3(Ga, Al)_5O_{12}$: $Ce^{3+}$, $Ca_3Sc_2Si_3O_{12}$: $Ce^{3+}$, $CaSc_2O_4$: $Eu^{2+}$, $(Ba, Sr)_2SiO_4$: $Eu^{2+}$, $Ba_3Si_6O_{12}N_2$: $Eu^{2+}$, $(Si, Al)_6 (O, N)$: $Eu^{2+}$ and the like can be used. $Y_3Al_5O_{12}$: $Ce^{3+}$ (YAG), $(Sr, Ba)_2SiO_4$: $Eu^{2+}$, $Ca_x(Si, Al)_{12}(O, N)_{16}$: $Eu^{2+}$ and the like can be used as the yellow phosphor of the phosphor layer 2.

As the phosphor layer 2, a phosphor material that disperses the phosphor powder in a glass, a glass phosphor that adds the light-emitting ion into the glass, and a phosphor ceramic that does not include a combined member such as a transparent resin can be employed. As the exemplary phosphor material, which disperses the phosphor powder in the glass, the phosphor material that disperses each phosphor powder of the above-described phosphors in a glass including an oxide component such as $P_2O_3$, $SiO_2$, $B_2O_3$, $Al_2O_3$ and the like can be used.

As the glass phosphor that adds the light-emitting ion into the glass, a nitride glass phosphor that adds an activator such as $Ce^{3+}$ and $Eu^{2+}$ in a nitride glass such Ca—Si—Al—O—N series, Y—Si—Al—O—N series and the like can be used. As the phosphor ceramic, a burning (sintered) phosphor that is made by burning (sintering) each of the above-described phosphors so as not to substantially include a resin component can be used, and among them, a translucent phosphor ceramic can also be used.

The translucent phosphor ceramic barely includes any pores and any impurities at the grain boundary which could cause a diffusion of light therein, and therefore can become a phosphor ceramic having translucency. Additionally, the translucent phosphor ceramic can be provided with a high thermal conductivity because pores and impurities would typically disturb a thermal diffusion. Accordingly, when the translucent phosphor ceramic is used as the phosphor layer 2, the semiconductor light source apparatus can reflect the excitation light emitted from each of the semiconductor light sources 5 and 5A and the excited light emitted from the phosphor layer 2 without loss of their light due to thermal diffusion, and also can efficiently radiate heat generated from the phosphor layer 2.

As an indication for evaluating a remaining amount of pores in the phosphor ceramic, a specific gravity of the phosphor ceramic can be used. In this case, if the specific gravity is more than 95 percentage with respect to a theoretical value of the phosphor ceramic, it may be desirable to employ the phosphor ceramic as the phosphor layer 2.

Here, a manufacturing method for the yellow phosphor YAG capable of being excited by the blue excitation light as an example of the phosphor layer 2 will now be described. The phosphor ceramic can be manufactured in order of a mixing process of raw materials, a forming process, a burning process and a fabricating process. Oxides of constituent element of YAG phosphor such as yttrium oxide, cerium oxide, alumina, etc. and carbonate, nitrate salt, hydro sulfate and the like that become an oxide after the burning can be used as raw materials so that each of the raw materials becomes a stoichiometric proportion with respect to each other.

In this case, a chemical compound of calcium, silicon and the like can be added for the purpose of an improvement of transmission of the phosphor ceramic after sintering. The raw materials can be dispersed in water or an organic solvent and can be mixed by a wet ball mill. Next, the mixed raw materials can be formed in a predetermined shape. A uniaxial pressure method, a cold isostatic pressure method, a slip casting method, a mold injection and the like can be used as the forming method. The translucent YAG phosphor ceramic can be produced by sintering the formed material at 1,600 to 1,800 degrees centigrade.

The above-described phosphor ceramic can be polished by polishing equipment so as to have a thickness of several multiples of ten micrometers to several hundred micrometers, a plate such as a round shape, a square shape, a fan shape, a rig shape and the like can be cut off by a scriber, dicer, etc. The phosphor ceramic can have a high reflectivity and can be easy to guide light in an extending direction of the plate. Accordingly, the phosphor ceramic can easily emit light in a direction toward a surface thereof by roughing the surface of the phosphor ceramic by etching and by forming side surfaces of the phosphor ceramic as reflecting surfaces.

The translucent phosphor ceramic can have a high thermal conductivity, and therefore can easily radiate the heat generated from the phosphor layer 2 via the radiating substrate 6. As the radiating substrate 6, an oxide ceramic, a non-oxide ceramic, a metallic plate and the like can be used. Especially, a metallic plate having a high reflectivity can be used, to provide a high thermal conductivity and a high workability to the radiating substrate 6. As the metallic plate of the radiating substrate 6, Al, Cu, Ti, Si, Ag, Au, Ni, Mo, W, Fe, Pd and the like and an alloy including at least one of the above-described metallic elements can be used. The radiating substrate 6 can be provided with a fin to improve the radiating efficiency.

As the adhesive material 7 connected between the phosphor layer 2 and the radiating substrate 6, an organic adhesive material, an inorganic adhesive material, a low-melting-point glass, and/or metallic brazing can be used. Metallic brazing, having a high reflectivity and a high thermal conductivity, can be realized by forming a metallic layer on a surface of the phosphor ceramic and by brazing between the metallic layer and the metallic surface of the radiating substrate 6.

The metallic layer on the phosphor ceramic can be formed by a vacuum vapor deposition method, a sputtering method, a high-melting-point metal method, etc. The high-melting-point metal method is a forming method, in which an organic binder including a metallic particle is applied on the surface of the phosphor ceramic and is heated at 1,000 to 1,700 degrees centigrade under a reductive atmosphere including water vapor and mercury. In this case, Si, Nb, Ti, Zr, Mo, Ni, Mn, W, Fe, Pt, Al, Au, Pd, Ta, Cu and an alloy including at least one of the metallic elements can be used as the metallic layer. As the metal brazing material, a brazing material including Ag, Cu, Zn, Ni, Sn, Ti, Mn, In, Bi and the like can be used.

In the case, after an oxide layer of the connecting surfaces between the metallic layer of the phosphor layer 2 and the metal plate of the radiating substrate 6 is removed by a flux if necessary, the phosphor layer 2 and the radiating substrate 6 can be connected by disposing the metal brazing material on at least one of the connecting surfaces and by cooling the connecting surfaces after heating them at 200 to 800 degrees Celsius.

In addition, in order to prevent a degradation between the phosphor layer 2 and the metallic layer and the like because of a difference between their thermal expansion coefficients, the phosphor layer 2 and the metallic layer and the like can also be connected via a material having an intermediary thermal expansion coefficient of their thermal expansion coefficients Each of the semiconductor light source apparatuses 20 and 25 shown in FIGS. 1a and 5a can include a single phosphor layer 2. However, the semiconductor light source apparatuses 30 and 35 of the disclosed subject matter can include a plurality of phosphor layers. For example, as shown in FIGS. 7 and 8, the phosphor layer 2 can include the green phosphor layer 2j and the red phosphor layer 2k. In this case, when each of the semiconductor light sources 5 and 5A emits blue light, each of the semiconductor light source apparatuses 30 and 35 can emit substantially white light due to an additive color mixture using lights excited by the green and red phosphor layer 2j, 2k and a part of the excitation blue light that is not excited by the phosphor layers 2j and 2k.

In the case, by adjusting a ratio of each amount of the light excited by the green and red phosphor layer 2j, 2k and an amount of the part of the excitation blue light that is not excited by the phosphor layers 2j and 2k, the semiconductor light source apparatuses 30 and 35 of the disclosed subject matter can emit lights having various color tones. The ratio of each amount of the above-described lights can be adjusted by varying at least one of each density of the green and red phosphor layer 2j, 2k and each thickness of the green and red phosphor layer 2j, 2k.

As described above, the phosphor layer 2 can include at least one of the red phosphor, the green phosphor and the yellow phosphor, and each of the semiconductor light sources 5 and 5A can emit the blue light. Accordingly, each of the semiconductor light source devices 20, 25, and 35 can emit various color lights by combining the phosphor layer 2 with each of the semiconductor light sources 5 and 5A. In addition, because the phosphor layer 2 cannot include the substantially resin component and can be efficiently radiated from the radiating substrate 6 via the adhesive material 7, a high power semiconductor light source such as a laser diode can be used under a large current as the semiconductor light source 5A. Thus, the disclosed subject matter can provide semiconductor light source apparatuses that can emit various color lights having a substantially uniform color tone and a large amount of light intensity.

FIGS. 9 to 12 are schematic basic structural views showing exemplary embodiments of lighting units using the semiconductor light source apparatuses 20, 25, 30 and 35 shown in FIGS. 1a, 5a, 7 and 8 made in accordance with principles of the disclosed subject matter, respectively. Each of the lighting units 40, 45, 50 and 55 shown in FIGS. 9 to 12 can be provided with optical lenses 24, 29, 34 and 39 to form a light distribution pattern for various usages using a wavelength converted reflective light emitted from the phosphor layer 2, respectively.

Figure 10:
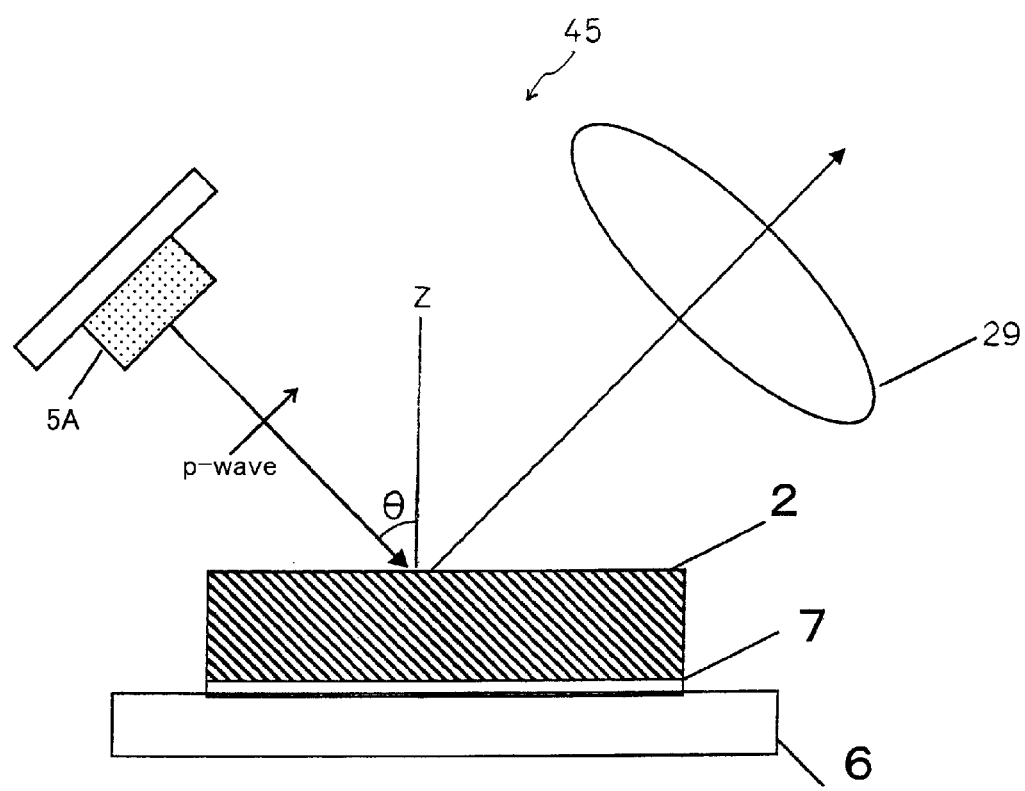
FIG. 10 is a schematic basic structural view showing another exemplary embodiment of a lighting unit using the semiconductor light source apparatus of FIG. 5a made in accordance with principles of the disclosed subject matter.
Figure 11:
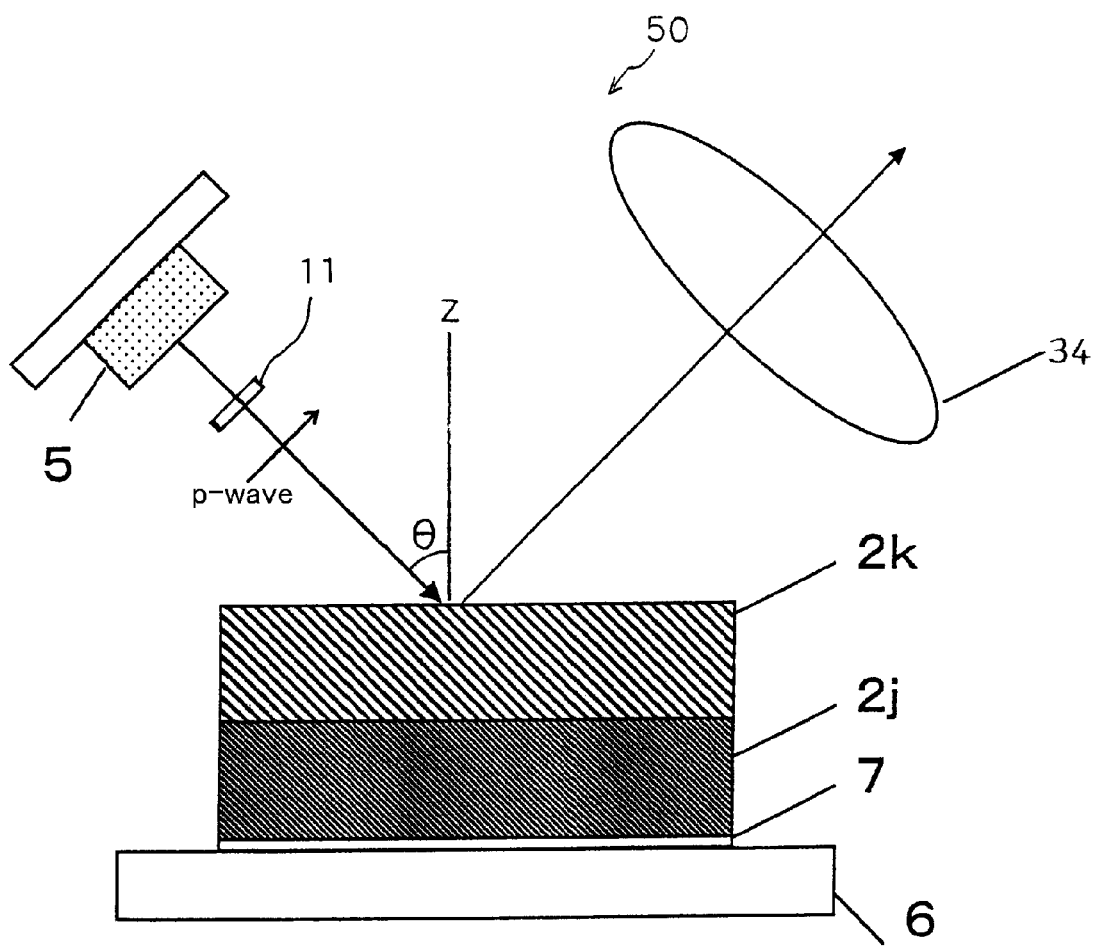
FIG. 11 is a schematic basic structural view showing another exemplary embodiment of a lighting unit using the semiconductor light source apparatus of FIG. 7 made in accordance with principles of the disclosed subject matter.
Figure 12:
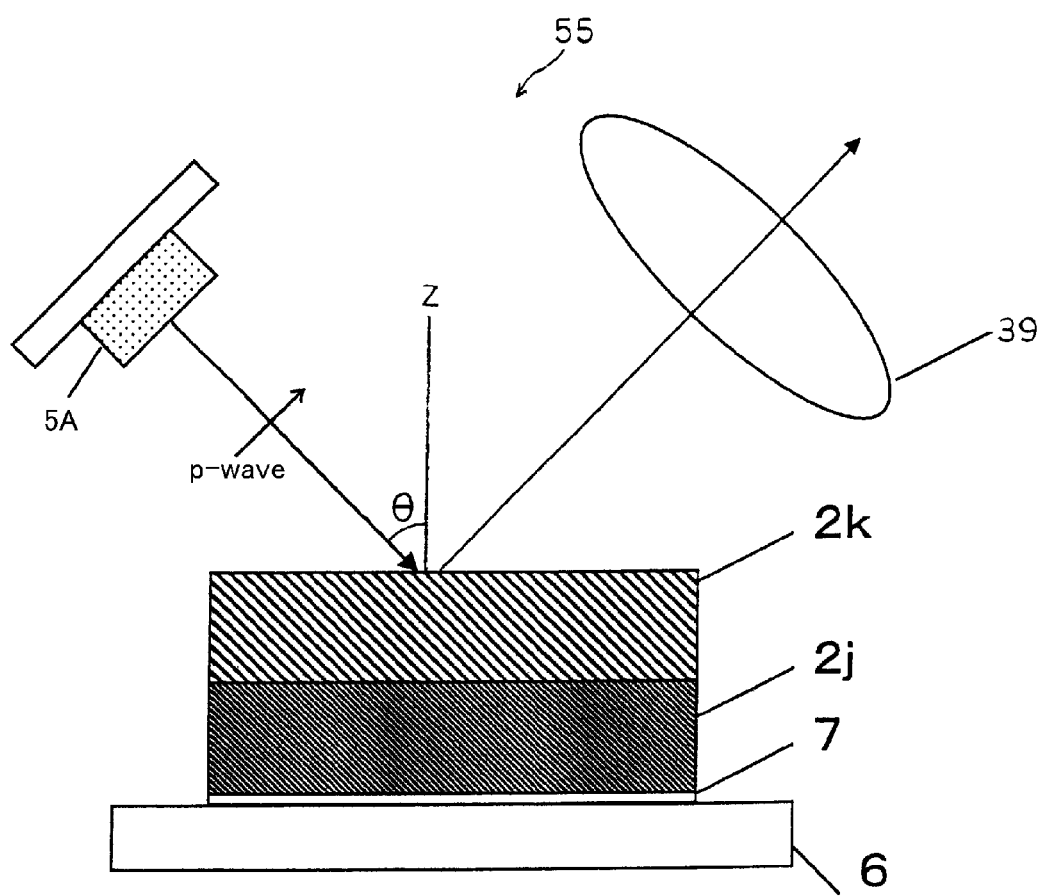
FIG. 12 is a schematic basic structural view showing another exemplary embodiment of a lighting unit using the semiconductor light source apparatus of FIG. 8 made in accordance with principles of the disclosed subject matter.
Figure 13:
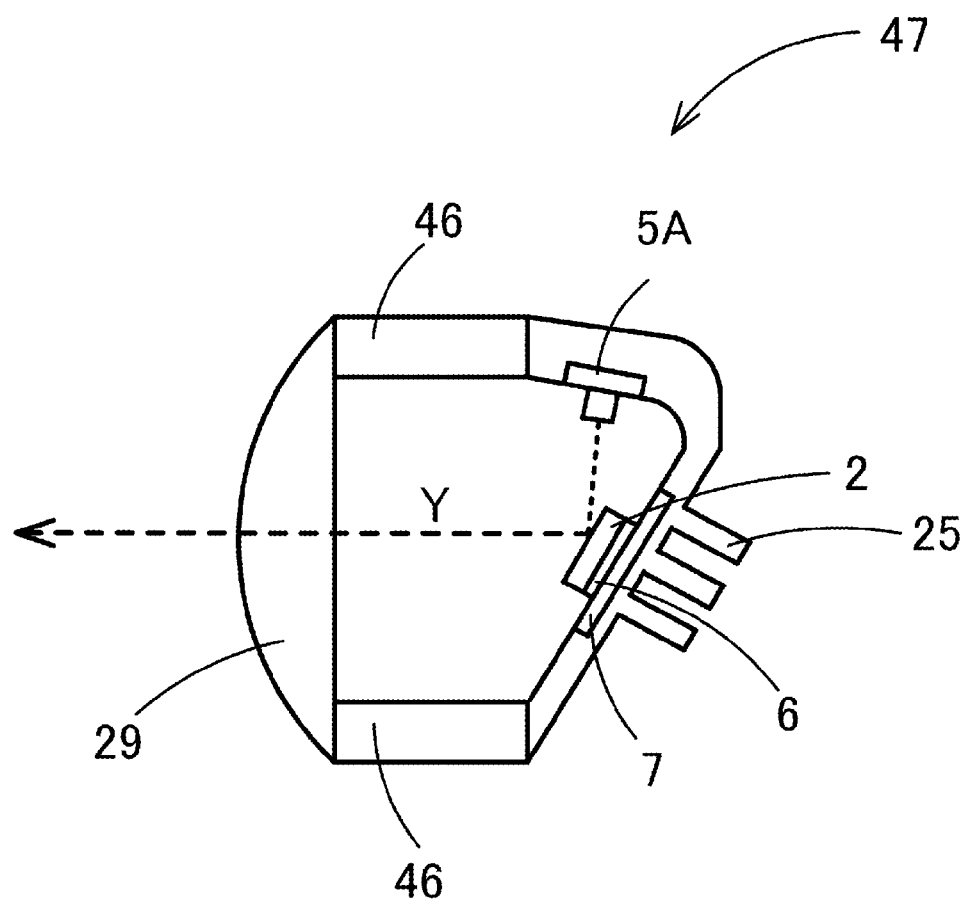
FIG. 13 is a schematic cross-section view showing an exemplary specific structure including the lighting unit shown in FIG. 10.

FIG. 13 is a schematic cross-section view showing an exemplary specific structure of the lighting unit 45 shown in FIG. 10. A more specific lighting unit 47 of the lighting unit 45 using the semiconductor light source apparatus 25 is described with reference to FIG. 13 as an exemplary more specific structure for the lighting units 40, 45, 50 and 55. The lighting unit 47 including the semiconductor light source apparatus 25 can include a housing 46 attaching the semiconductor light source 25 thereto and the optical lens 29 located adjacent to the housing 46. In this case, the optical lens 29 can be located in front of the semiconductor light source apparatus 25 so as to match light distributions for various lighting units.

The optical lens 29 can include a projector lens having an optical axis, which is composed of a convex lens. When the optical axis of the projector lens corresponds to the substantially optical axis Y of the semiconductor light source 5A, the lighting unit 47 including the projector lens can provide a favorable light distribution in focus for a projector, a stage lighting, etc. In addition, the optical lens 29 can include a zoom lens having an optical axis, which is structured by at least one convex lens and at least one concave lens.

When the optical axis of the zoom lens corresponds to the substantially optical axis Y of the semiconductor light source 5A, because the light unit 47 can provide a favorable light distribution in focus, the lighting unit 47 including the zoom lens can be used for a lighting system having a zoom function such as a projector, stage lighting, etc. Thus, the disclosed subject matter can provide adjustable high power lighting units having high brightness and favorable light distributions by using a high power semiconductor light source, which can be used for various lighting units such as a projector, a stage lighting, general lighting, a vehicle lamp such as a headlight, etc.

Various modifications of the above disclosed embodiments can be made without departing from the spirit and scope of the presently disclosed subject matter. For example, cases where the above-described phosphor layers 2 are formed in a substantially square shape are described. However, the phosphor layer 2 are not limited to this shape and can be formed in various shapes such as an ellipsoidal shape and the like. In addition, the specific arrangement between components can vary between different applications, and several of the above-described features can be used interchangeably between various embodiments depending on a particular application of the device.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A semiconductor light source apparatus, comprising:
a substrate having a mounting surface;
at least one phosphor layer having a refraction index $n2$ disposed on the mounting surface of the substrate via an adhesive material, and the at least one phosphor layer having at least one of, a glass phosphor and a phosphor ceramic, which includes substantially no resin component;
a polarizer located adjacent to the at least one phosphor layer;
a semiconductor light source configured to emit blue light having a field vector, an optical axis, a light-emitting area and an incident angle with respect to the at least one phosphor layer, the optical axis of the semiconductor light source intersecting with the mounting surface of the substrate at an angle between 0 degrees and 90 degrees, the light-emitting area of the semiconductor light source being located on the at least one phosphor layer to wavelength-convert the blue light emitted from the semiconductor light source by the at least one phosphor layer, and the semiconductor light source being configured such that the blue light emitted from the semiconductor light source travelling along the optical axis changes direction toward the at least one phosphor layer after being reflected from at least one of the substrate and the adhesive material, wherein the field vector of the blue light is substantially parallel with an imaginary plane which connects an incident direction of the blue light directed toward the at least one phosphor layer to a normal line of an incident surface of the at least one phosphor layer.

2. The semiconductor light source apparatus according to claim 1, wherein the incident angle of the blue light with respect to the at least one phosphor layer is more than arctangent ((the refraction index of the at least one phosphor layer $n2-0.5$)/$n1$) and is less than arctangent ((the refraction index of the at least one phosphor layer $n2+0.5$)/$n1$), when a refraction index of matter located between the polarizer and the at least one phosphor layer is referred to as $n1$.

3. The semiconductor light source apparatus according to claim 1, wherein the at least one phosphor layer is selected from the group consisting of a yellow phosphor ceramic, and two phosphor layers including a red phosphor layer and a green phosphor layer.

4. The semiconductor light source apparatus according to claim 2, wherein the at least one phosphor layer is selected from the group consisting of a yellow phosphor ceramic, and two phosphor layers including a red phosphor layer and a green phosphor layer.

5. The semiconductor light source apparatus according to claim 1, wherein the at least one phosphor layer is a translucent YAG phosphor ceramic.

6. The semiconductor light source apparatus according to claim 2, wherein the at least one phosphor layer is a translucent YAG phosphor ceramic.

7. A semiconductor light source apparatus, comprising:
a substrate having a mounting surface;
at least one phosphor layer having a refraction index $n2$ disposed on the mounting surface of the substrate via an adhesive material, and the at least one phosphor layer having at least one of, a glass phosphor and a phosphor ceramic, which includes substantially no resin component;

a semiconductor light source configured to emit a blue laser light having a field vector, an optical axis, a light-emitting area and an incident angle with respect to the at least one phosphor layer, the semiconductor light source located adjacent to the at least one phosphor layer so that the optical axis of the semiconductor light source intersects with the mounting surface of the substrate at an angle between 0 degrees and 90 degrees, the light-emitting area of the semiconductor light source being located on the at least one phosphor layer to wavelength-convert the blue laser light emitted from the semiconductor light source by the at least one phosphor layer, and the semiconductor light source being configured such that the blue laser light emitted from the semiconductor light source travelling along the optical axis changes direction toward the at least one phosphor layer after being reflected from at least one of the substrate and the adhesive material, wherein the field vector of the blue laser light is substantially parallel with an imaginary plane which connects an incident direction of the blue laser light directed toward the at least one phosphor layer to a normal line of an incident surface on the at least one phosphor layer.

8. The semiconductor light source apparatus according to claim 7, wherein the incident angle of the blue laser light with respect to the at least one phosphor layer is more than arctangent ((the refraction index of the at least one phosphor layer $n2-0.5)/n1$) and is less than arctangent ((the refraction index of the at least one phosphor layer $n2+0.5)/n1$), when a refraction index of a matter located between the semiconductor light source and the at least one phosphor layer is referred to as $n1$.

9. The semiconductor light source apparatus according to claim 7, wherein the at least one phosphor layer is selected from the group consisting of a yellow phosphor ceramic, and two phosphor layers including a red phosphor layer and a green phosphor layer.

10. The semiconductor light source apparatus according to claim 8, wherein the at least one phosphor layer is selected from the group consisting of a yellow phosphor ceramic, and two phosphor layers including a red phosphor layer and a green phosphor layer.

11. The semiconductor light source apparatus according to claim 7, wherein the at least one phosphor layer is a translucent YAG phosphor ceramic.

12. The semiconductor light source apparatus according to claim 8, wherein the at least one phosphor layer is a translucent YAG phosphor ceramic.

13. A lighting unit including the semiconductor light source apparatus according to claim 1, further comprising:
a housing located adjacent to the semiconductor light source apparatus; and
a projector lens having an optical axis located adjacent to the housing so that the optical axis of the projector lens substantially corresponds to the optical axis of the semiconductor light source.

14. A lighting unit including the semiconductor light source apparatus according to claim 2, further comprising:
a housing located adjacent to the semiconductor light source apparatus; and
a projector lens having an optical axis located adjacent to the housing so that the optical axis of the projector lens substantially corresponds to the optical axis of the semiconductor light source.

15. The lighting unit according to claim 13, wherein the at least one phosphor layer is selected from the group consisting of a yellow phosphor ceramic, and two phosphor layers including a red phosphor layer and a green phosphor layer.

16. The lighting unit according to claim 13, wherein the at least one phosphor layer is selected from the group consisting of a yellow phosphor ceramic, and two phosphor layers including a red phosphor layer and a green phosphor layer.

17. A lighting unit including the semiconductor light source apparatus according to claim 7, further comprising:
a housing located adjacent to the semiconductor light source apparatus; and
a projector lens having an optical axis located adjacent to the housing so that the optical axis of the projector lens substantially corresponds to the optical axis of the semiconductor light source.

18. A lighting unit including the semiconductor light source apparatus according to claim 8, further comprising:
a housing located adjacent to the semiconductor light source apparatus; and
a projector lens having an optical axis located adjacent to the housing so that the optical axis of the projector lens substantially corresponds to the optical axis of the semiconductor light source.

19. The lighting unit according to claim 17, wherein the at least one phosphor layer is selected from the group consisting of a yellow phosphor ceramic, and two phosphor layers including a red phosphor layer and a green phosphor layer.

20. The lighting unit according to claim 18, wherein the at least one phosphor layer is selected from the group consisting of a yellow phosphor ceramic, and two phosphor layers including a red phosphor layer and a green phosphor layer.

* * * * *